United States Patent [19]
Kobayashi et al.

[11] Patent Number: 6,122,493
[45] Date of Patent: *Sep. 19, 2000

[54] RADIO RECEIVER HAVING AUTOMATIC BROADCASTING-STATION SELECTING FUNCTION

[75] Inventors: Keiji Kobayashi, Gunma-ken; Sakae Sugayama, Ota, both of Japan

[73] Assignee: Sanyo Electric Co., Ltd., Osaka, Japan

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/756,532

[22] Filed: Nov. 25, 1996

[30] Foreign Application Priority Data

Nov. 27, 1995 [JP] Japan ................................. 7-307640
Mar. 29, 1996 [JP] Japan ................................. 8-076802

[51] Int. Cl.$^7$ ................................................ H04B 1/00
[52] U.S. Cl. ................................ 455/193.1; 455/193.2
[58] Field of Search ............................ 455/161.2, 164.1, 455/182.1, 182.2, 192.2, 193.1

[56] References Cited

U.S. PATENT DOCUMENTS

| | | | |
|---|---|---|---|
| 3,247,365 | 4/1966 | Dell et al. | 364/723 |
| 3,412,240 | 11/1968 | Hunt et al. | 364/723 |
| 3,748,447 | 7/1973 | Hajicek et al. | 364/723 |
| 4,048,570 | 9/1977 | Sumi | 455/180.1 |
| 4,955,073 | 9/1990 | Sugayama | 455/161.3 |
| 5,175,701 | 12/1992 | Newman et al. | 364/723 |
| 5,203,031 | 4/1993 | Sugayama | 455/182.1 |
| 5,212,817 | 5/1993 | Atkinson | 455/161.2 |
| 5,239,701 | 8/1993 | Ishii | 455/180.1 |
| 5,280,641 | 1/1994 | Ishii et al. | 455/254 |
| 5,280,643 | 1/1994 | Ishii | 455/254 |
| 5,321,851 | 6/1994 | Sugayama et al. | 455/161.3 |
| 5,842,120 | 11/1998 | Kobayashi | 455/179.1 |

FOREIGN PATENT DOCUMENTS

| | | | |
|---|---|---|---|
| 473120 | 4/1992 | European Pat. Off. . | |
| 57-157651 | 9/1982 | Japan . | |
| 9-148890 | 6/1997 | Japan | H03J 7/18 |
| 1591797 | 6/1981 | United Kingdom | H03J 5/00 |

*Primary Examiner*—Reinhard J. Eisenzopf
*Assistant Examiner*—Makoto Aoki
*Attorney, Agent, or Firm*—Hogan & Hartson LLP

[57] ABSTRACT

The capacitance value of a variable capacitance element of an RF tuning circuit is controlled in accordance with a control signal Vx. When an automatic search start signal is supplied to a frequency control circuit, frequencies of the local oscillation signal are changed and received frequencies are changed. A storage circuit stores the control data for each predetermined frequency corresponding to the frequency characteristic of the tuning element. When local oscillation frequencies are changed in accordance with an automatic search start signal, an arithmetic circuit computes a control signal Vx in accordance with the data corresponding to the changed received frequency and the control data and thereby, the variable capacitance element is controlled in accordance with the control signal Vx and tuning frequencies are changed so that a tuning frequency coincides with a received frequency. Under the above state, when the electric-field intensity of a received signal reaches a certain level or higher, the frequency control circuit stops the change of frequencies of a local oscillation signal and stops automatic broadcasting-station selection.

46 Claims, 7 Drawing Sheets

RADIO RECEIVER HAVING AUTOMATIC BROADCASTING-STATION SELECTING FUNCTION

BACKGROUND OF THE INVENTION

1. Field of the Invention

The present invention relates to a radio receiver for correcting deviation of an RF (Radio Frequency) tuning frequency due to dispersion in variable capacitance elements, thereby shortening search time.

1. Description of the Prior Art

Radio receivers are heretofore known which are equipped with a control circuit for generating digital data to obtain an optimum receiving state by changing the digital data. Among such kinds of radio receivers, FIG. 1 shows a conventional AM radio receiver in which both the frequency of a local oscillation signal and the tuning frequency of an RF tuning circuit are correspondingly controlled to output data of a control circuit.

In FIG. 1, a received RF signal is frequency-selected by an RF tuning circuit (1) and thereafter amplified by an RF amplifying circuit (2). An output signal of the RF amplifying circuit (2) is converted to a 450 KHz IF (Intermediate Frequency) signal in a mixing circuit (3) in accordance with a local oscillation signal generated by a local oscillation circuit (4) and moreover, the IF signal is amplified by an IF amplifying circuit (5) and then AM-detected by a wave detector (6).

Moreover, when the AM radio receiver in FIG. 1 receives radio waves from a desired broadcasting station, frequency divided data for setting a frequency dividing ratio of a programmable divider included in a PLL control circuit (8) is applied to the programmable divider from a control circuit (7). Because the local oscillation circuit (4) and the PLL control circuit (8) form a PLL, the frequency of a local oscillation signal is locked to a frequency corresponding to the frequency divided data. Moreover, the local oscillation signal is also applied to the mixing circuit (3) and an RF signal from the desired broadcasting station is converted to an IF signal.

Furthermore, the output data generated by the control circuit (7) is supplied to a variable capacitance element (1a) through a fine-tuning circuit (9) and thereby the capacitance value of a tuning element comprising the variable capacitance element (1a) and an inductance element (1b) is controlled and the tuning frequency of the tuning element is coarsely tuned. For example, the whole AM receiving band is divided into 13 bands, the control circuit (7) judges in which band the frequency of a desired broadcasting station is included in accordance with the frequency divided data and coarsely tunes the RF tuning circuit (1) to a frequency included in a corresponding band.

Then, the fine-tuning circuit (9) begins fine tuning in accordance with the output data by finely tuning the tuning frequency of the RF tuning circuit (1) every micro interval, that is, by dividing a band into 64 parts. A received electric-field intensity when set to each tuning frequency is detected by an electric-field detecting circuit (10) and the control data in the variable capacitance element (1a) and data showing the electric field intensity corresponding to the control data are temporarily stored in a storage circuit (11). The control circuit (7) detects the maximum-level electric-field intensity out of the data showing electric field intensities stored in the storage circuit (11) and sets the tuning frequency of the RF tuning circuit (1) to a frequency by which the maximum-level electric-field intensity is obtained. Therefore, it is possible to prevent a tracking error due to the dispersion in variable capacitance elements for setting the tuning frequency of the RF tuning circuit (1).

Radio receivers are heretofore known which are provided with a control circuit comprising a microcomputer or the like for generating digital data to obtain an optimum receiving state by changing the digital data. Among these types of radio receivers, FIG. 1 shows a radio receiver for generating frequency-divided digital data for setting the frequency of a local oscillation signal and changing the tuning frequencies of an RF tuning circuit in accordance with a predetermined received electric-field intensity.

In the case of the radio receiver in FIG. 1, an AM reception band is divided into a plurality of bands to coarsely tune the tuning frequency of the RF tuning circuit (1) to the band. However, when the AM receiving band is roughly divided, the range of fine tuning is widened. Therefore, problems occur that the number of data values for the fine-tuning variable capacitance element (1a) increases and time for fine tuning is lengthened. That is, the length of time until tuning is completed after the tuning is begun is a large problem for a listener and a large factor for radio receiver sets. For example, when dividing an AM receiving band into 13 bands and finely tuning them with 6-bit data, a fine tuning time of approx. 300 msec is required. When a received electric-field intensity of a predetermined level or higher is detected at the time of search, a problem occurs that the search time increases because fine tuning is performed each time.

However, when finely dividing an AM receiving band for coarse adjustment in order to decrease the fine tuning time, if there is a desired broadcasting station around the boundary between divided bands, a problem occurs that the tuning frequency is not included in the bands due to the dispersion in values of the variable capacitance element (1a) and receiving sensitivity deteriorates. Particularly when finely dividing an AM receiving band, the number of boundaries between bands increases. Therefore, the above problem frequently occurs. To solve the problem, it is necessary to control the dispersion in tuning frequencies. However, a new problem occurs that selection of varactor diodes is necessary.

As shown in FIG. 2, it is heretofore known that an AM radio receiver is equipped with a broad-band receiving mode and a narrow-band receiving mode. This type of conventional AM radio receiver eliminates tracking errors by receiving RF signals in a broad band at the time of automatic broadcasting-station selection and prevents erroneous stop during automatic broadcasting-station selection in an undesired broadcasting station due to sensitivity deviation.

In FIG. 2, a received RF signal is amplified by an RF amplifying circuit (31) and thereafter tuned by an RF narrow-band tuning (RF tuning) circuit (32) at the time of normal reception. An output signal of the RF tuning circuit (32) is applied to the mixing circuit (3) through a selection circuit (34) under the state of selecting an output signal of the tuning circuit (32). In the mixing circuit (3), an output signal of the selection circuit (34) and a local oscillation signal of the local oscillation circuit (4) are mixed and converted to an IF signal. The IF signal is limited to a predetermined band by an IF filter (36), amplified by an IF amplifying circuit (37), and thereafter AM-detected by an AM detecting circuit (38).

Moreover, a search start signal showing the start of automatic broadcasting-station selection is applied to a control circuit (41) at the time of automatic broadcasting-station selection and thereby, the control circuit (41) applies a control signal to the selection circuit (34) and the local oscillation circuit (4). The selection circuit (34) selects an output signal of the RF broad-band tuning circuit (30) in accordance with the control signal. Because the frequency selection characteristics of the RF broad-band tuning circuit (30) has a broad band, a tracking error is prevented in which a tuning frequency at the RF stage deviates from a received frequency. Under the above state, received frequencies are changed by changing local oscillation frequencies, an electric field intensity is detected by the broadcasting-station detecting circuit (40) in accordance with an output signal of the IF amplifying circuit (37) whenever received frequencies are changed, and presence of a broadcasting station is detected in accordance with whether a received electric-field intensity has a predetermined value. When a broadcasting station is detected, automatic broadcasting-station selection is stopped in accordance with an output signal of the broadcasting-station selection circuit (40), and the selection circuit (34) selects an output signal of the RF tuning circuit (32) and then it is brought under the normal receiving state.

However, though the RF broad-band tuning circuit (30) is selected at the time of automatic broadcasting-station selection, almost all frequency bands of output signals of the RF amplifying circuit (31) are applied to the mixing circuit (3) without being band-limited because the frequency selection characteristics of the RF broad-band tuning circuit (30) have a wide range. For example, if two signals with a strong electric field are included in many input signals of the mixing circuit (3), the signals of which frequencies are the difference between or sum of the two signals with a strong electric field and moreover, a harmonic signal two times larger than each signal are generated due to the square characteristics of a nonlinear element at the input stage of the mixing circuit (3). When the frequencies of the two signals are represented by fa and fb, respectively, disturbance signals of (fa+fb), (fa−fb), 2×fa, and 2×fb are generated on the nonlinear element and moreover intermodulation disturbance occurs. The disturbance signals are transmitted to the IF filter (36), IF amplifying circuit (37), and AM detecting circuit (38). There is a problem that a broadcasting station is erroneously detected by the broadcasting-station detecting circuit (4) if the disturbance signals have a high level which results in an erroneous stop, where automatic broadcasting-station selection is stopped even though there is no broadcasting station, occurring during automatic broadcasting-station selection.

SUMMARY OF THE INVENTION

The present invention is intended to solve the above problems, and its object is to securely correct a deviation of a tuning frequency due to the dispersion in tuning elements and shorten the time for automatically selecting a broadcasting station. Moreover, it is another object to prevent erroneous stop or erroneous passing due to intermodulation disturbance at the time of automatic selection of a broadcasting station.

For the achievement of the above objects, a radio receiver of the present invention comprises; a radio frequency tuning circuit including a tuning element whose frequency characteristics can be changed in accordance with a control signal in order to set a tuning frequency, a mixing circuit for converting an output signal of the radio frequency tuning circuit to an intermediate-frequency signal in accordance with a local oscillation signal, a local oscillation circuit for generating the local oscillation signal, a circuit for controlling the local oscillation circuit and generating the control signal in accordance with a received frequency and the frequency characteristic of the tuning element at the time of automatic broadcasting-station selection, and a broadcasting-station detecting circuit for detecting whether radio waves of a broadcasting station are present in the received frequency, the automatic broadcasting-station selection being stopped in accordance with a broadcasting-station detection signal supplied from the broadcasting-station detecting circuit.

The above-mentioned circuit for controlling said local oscillation circuit and generating said control signal comprises; a frequency control circuit for changing the frequencies of said local oscillation signal at the time of automatic broadcasting-station selection, a storage circuit for storing the control data for each predetermined frequency corresponding to the frequency characteristics of said turning element, and an arithmetic circuit for computing said control signal in accordance with the data corresponding to a received frequency and said control data.

According to another aspect of the present invention, a radio receiver having an automatic broadcasting-station selecting function which comprises; a radio frequency narrow-band tuning circuit including a tuning element which has a first frequency selection characteristic and whose frequency characteristics can be changed in accordance with a control signal in order to set a tuning frequency, a radio frequency broad-band tuning circuit having a second frequency selection characteristic wider than said first frequency selection characteristic, a selection circuit for selecting either of output signals supplied from said radio frequency narrow-band tuning circuit and said frequency broad-band tuning circuit, a mixing circuit for converting an output signal supplied from said selection circuit to an intermediate-frequency signal, a local oscillation circuit for generating a local oscillation signal, a circuit for generating a first selection signal for making the selection circuit select an output signal supplied from the radio frequency broad-band tuning circuit and controlling said local oscillation circuit when automatic broadcasting-station selection is started, a circuit for generating a second selection signal for making said selection circuit select an output signal supplied from said radio frequency narrow-band tuning circuit and generating said control signal in accordance with a received frequency and the frequency characteristic of said tuning element when a broadcasting station is detected at the time of broad-band tuning reception, a broadcasting-station detecting circuit for detecting a broadcasting station at the time of narrow-band tuning reception, and a broadcasting-station selection stopping circuit for stopping generation of said broadcasting-station selection signal in accordance with an output signal supplied from said broadcasting-station detecting circuit.

According to still another aspect of the present invention, a radio receiver having an automatic broadcasting-station selecting function which comprises; a radio frequency narrow-band tuning circuit including a tuning element which has a first frequency selection characteristic and whose frequency characteristics can be changed in accordance with a control signal in order to set a tuning frequency, a radio frequency broad-band tuning circuit having a second frequency selection characteristic wider than said first frequency selection characteristic, a selection circuit for selecting either of output signals supplied from the radio frequency narrow-band tuning circuit and said radio frequency broad-band tuning circuit, a mixing circuit for converting an output signal supplied from said selection circuit to an intermediate frequency signal, a local oscillation circuit for generating a local oscillation signal, a broadcasting-station selection control circuit for controlling said local oscillation circuit so as to sequentially change the frequencies of said local oscillation signal when automatic broadcasting-station selection is started, a first broadcasting-station detecting circuit for generating a first broadcasting-station detection signal when detecting a broadcasting station during the operation of automatic broadcasting-station selection, a selection signal generating circuit for generating a first selection signal for making the selection circuit select an output signal supplied form said radio frequency broadband tuning circuit when automatic broadcasting-station selection is started and generating a second selection signal for making said selection circuit select an output signal supplied from said radio frequency narrow-band tuning circuit in accordance with said first broadcasting-station detection signal, a tuning control circuit for generating said control signal in accordance with a received frequency, and the frequency characteristic of said tuning element when the first broadcasting-station detection signal is generated, a second broadcasting-station detecting circuit for generating a second broadcasting-station detection signal when detecting a broadcasting station in accordance with a received frequency after said tuning frequency is controlled in accordance with said control signal, and a broadcasting-station selection stopping section for stopping the change of the frequencies of said local oscillation signal in accordance with said second broadcasting-station detection signal.

In consequence, broadcasting-station detection can be performed in the tuning receiving mode after performing broadcasting-station detection in the broad-band receiving mode at the time of automatic broadcasting-station selection, and it is therefore possible to prevent an erroneous stop or erroneous passing of automatic broadcasting-station selection due to a sensitivity deviation, eliminate a disturbance signal due to intermodulation, and prevent erroneous stop or passing of automatic broadcasting-station selection due to intermodulation.

In particular, the tuning frequency of an RF narrow-band tuning circuit is adjusted to a value close to a received RF frequency in accordance with an operation result, and hence RF signals other than a received RF signal are not applied to a mixing circuit, and thereby it is possible to decrease the frequency of disturbance signal generation due to intermodulation.

Moreover, because the tuning frequency of an RF tuning circuit is set to a value close to each radio frequency of actual broadcasting-stations, it is possible to keep the minimum broadcasting-station detection level always constant and securely detect a broadcasting station by changing sensitivities in accordance with the tuning reception and the aperiodic reception.

DESCRIPTION OF THE PREFERRED EMBODIMENTS

Embodiment 1

Figure 1:
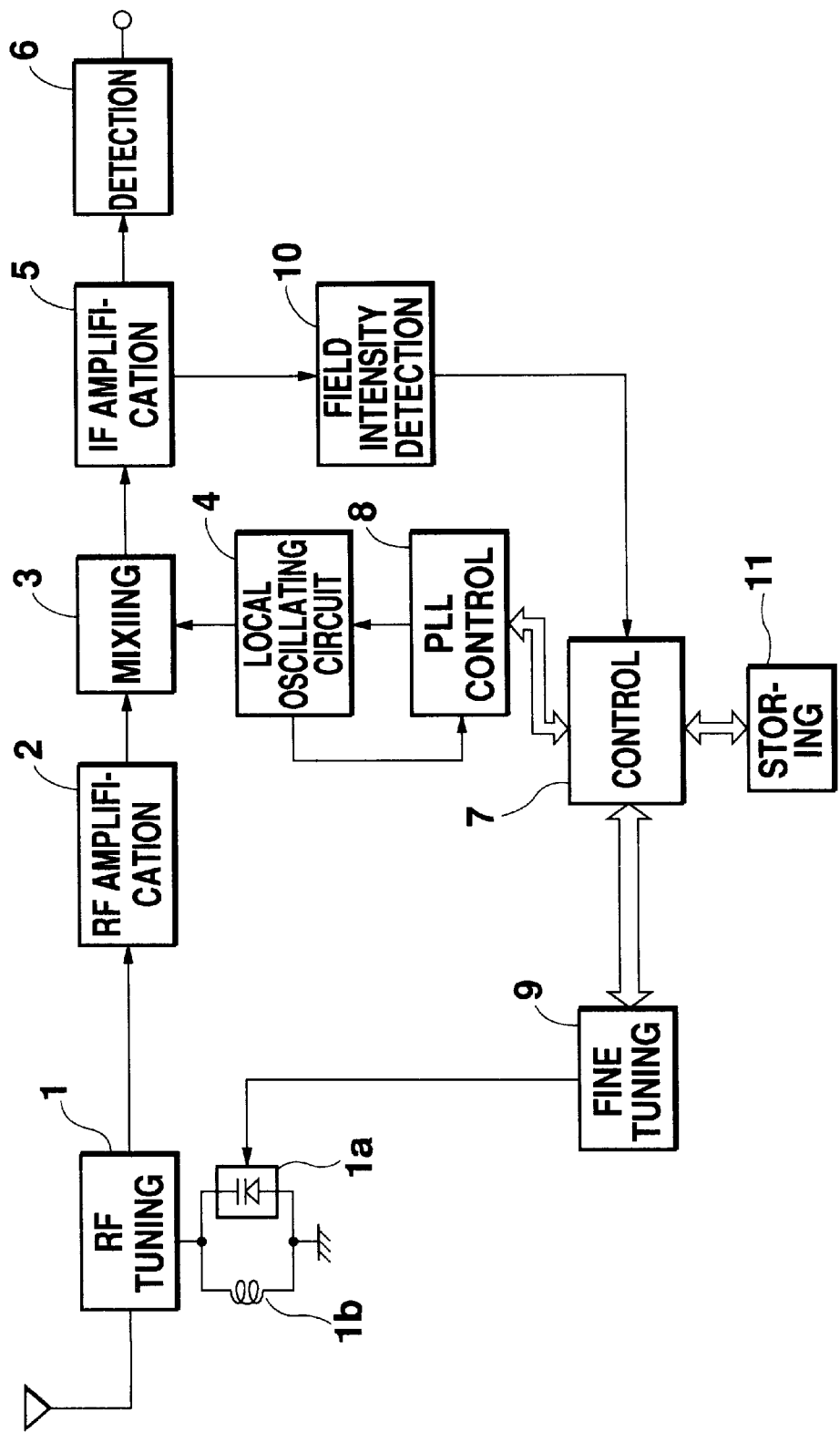
FIG. 1 is an illustration showing the structure of a conventional radio receiver.
Figure 2:
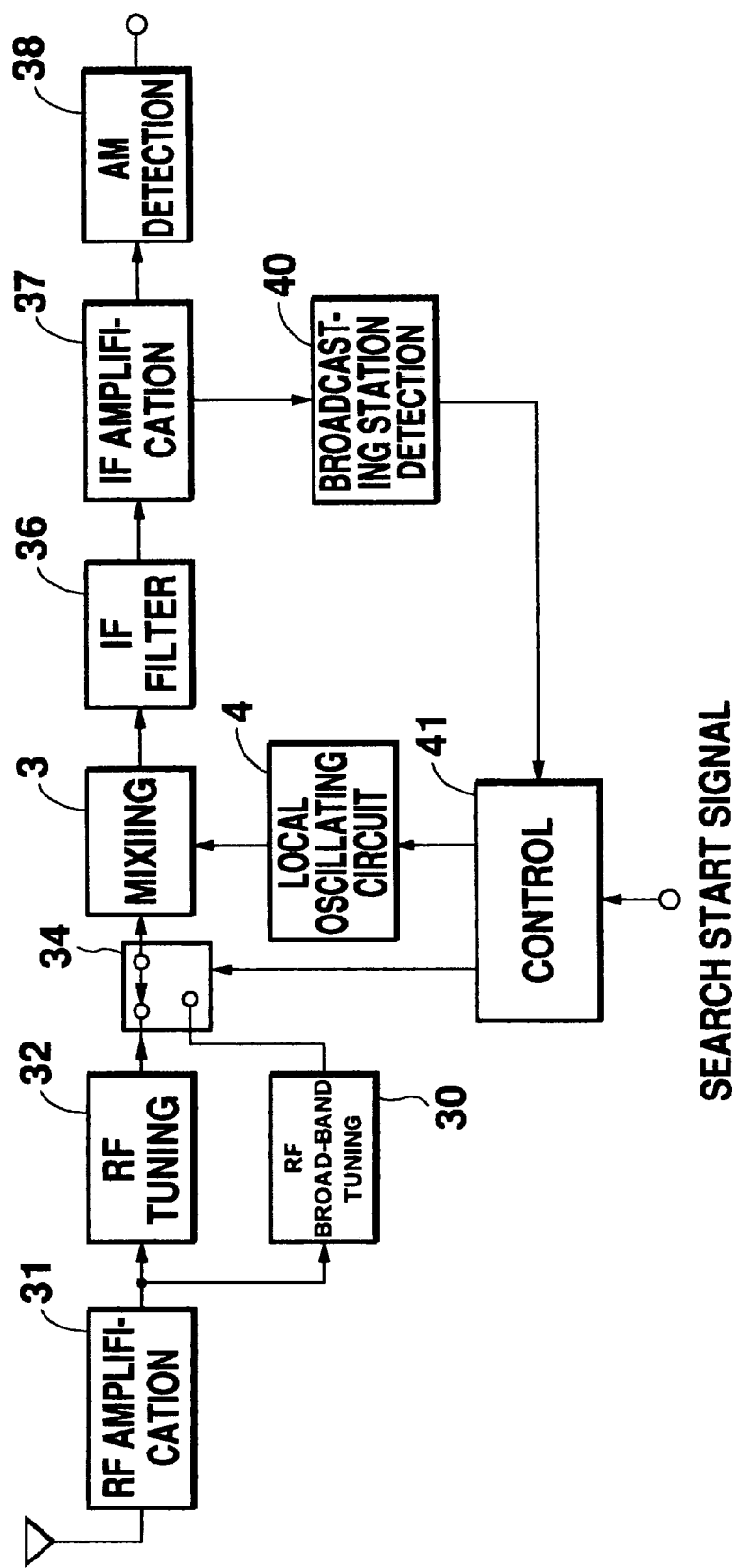
FIG. 2 is an illustration showing the structure of a conventional radio receiver.
Figure 3:
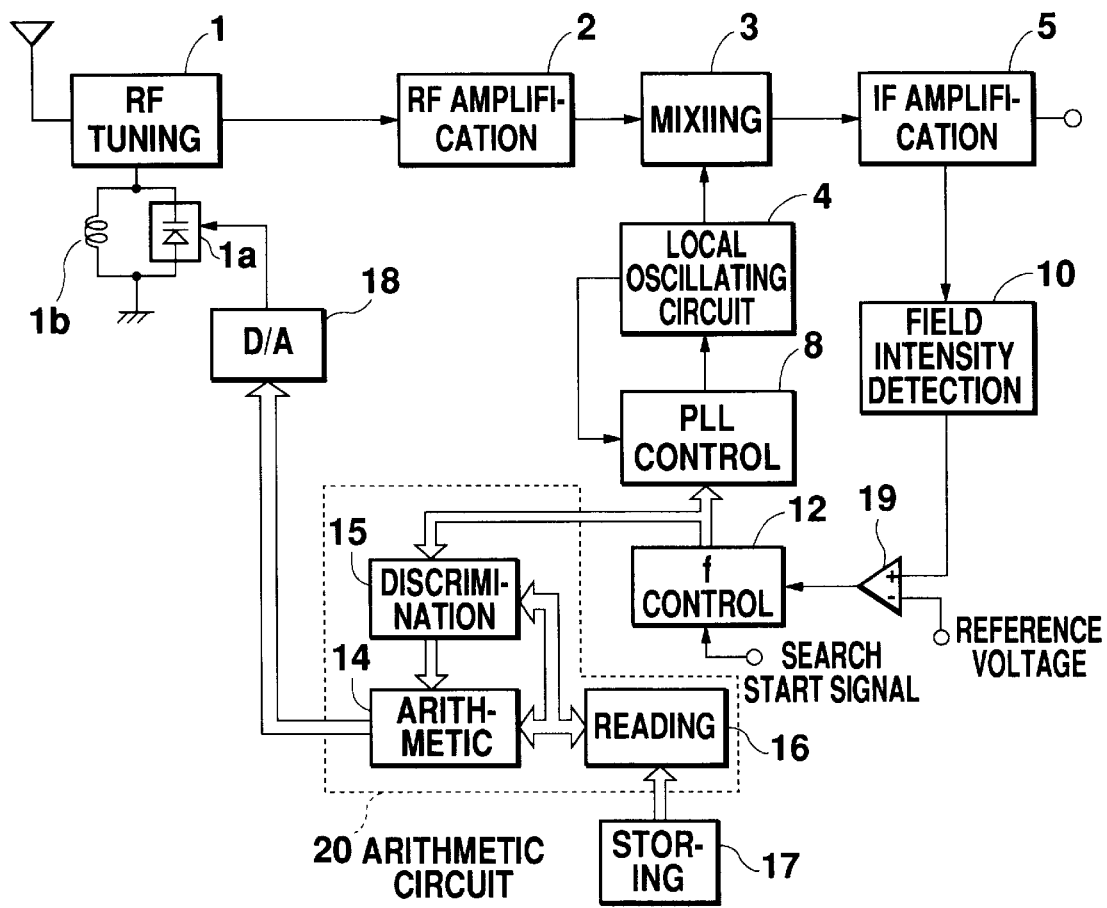
FIG. 3 is an illustration showing the structure of the radio receiver of Embodiment 1 of the present invention.

FIG. 3 shows Embodiment 1 of the present invention, in which symbol (12) denotes a frequency control circuit for generating data for the frequency dividing ratio of a PLL control circuit (8), (20) denotes an arithmetic circuit comprising an arithmetic section (14) for obtaining a control signal through operations, a discriminating section (15) for discriminating whether the data showing a desired broadcasting station is present in a predetermined range, and a reading section (16) for reading and outputting control data. Symbol (17) denotes a storage circuit for storing the control data for each predetermined frequency, (18) denotes a D-A (digital-analog) conversion circuit for digital-analog converting a control signal, and (19) denotes a comparison circuit for comparing an output signal of the electric-field detecting circuit (10) with a reference voltage. In FIG. 3, a circuit same as that of the conventional example in FIG. 1 is provided with the same symbol as that of the conventional example in FIG. 1 and its description is omitted.

In FIG. 3, it is assumed that radio waves are received from a broadcasting station. Under this state, a local oscillation signal generated by the local oscillation circuit (4) forming a PLL with the PLL control circuit (8) is locked to a frequency corresponding to frequency divided data and applied to the mixing circuit (3). Moreover, the capacitance value of the variable capacitance element (1a) is controlled in accordance with an output signal of the D-A conversion circuit (18) and the tuning frequency of the RF tuning circuit (1) is made almost equal to the frequency of radio waves of a desired broadcasting station.

In the above receiving state, a received RF signal is tuned and frequency-selected by the tuning frequency set in accordance with the capacitance of the variable capacitance element (1a) in the RF tuning circuit (1). An output signal of the RF tuning circuit (1) is amplified by the RF amplifying circuit (2) and thereafter, mixed with a local oscillation signal of the local oscillation circuit (4) and converted to an IF signal. Then, the IF signal is amplified by the IF amplifying circuit (5) and AM-detected by a rear-stage detecting circuit (not shown in FIG. 3).

Next, automatic broadcasting-station selection (search) of a radio receiver will be described below, referring to the flow chart in FIG. 4. First, a search start signal is applied to the frequency control circuit (12) and search is started (S1). The frequency control circuit (12) confirms a present received frequency in accordance with frequency divided data (S2). Afterward, the frequency control circuit (12) changes the frequency divided data so that the received frequency comes to the frequency of the next channel and thereby, a local oscillation signal corresponding to the frequency divided data is generated and the next channel is received (S3). In this case, the next channel denotes a frequency band different by the frequency assigned interval between predetermined broadcasting radio waves. The frequency divided data is also applied to the arithmetic circuit (20). Because the frequency divided data corresponds to a local oscillation frequency, the discriminating section (15) calculates the next channel frequency f0 in accordance with changed frequency divided data. Then, the discriminating section (15) discriminates whether the frequency f0 is present in the range between the frequency f1 and the frequency f2 higher than the frequency f1 (S4).

When the received frequency f0 is present in the range of f1≦f0<f2, the reading section (16) reads the control data Vt1 and Vt2 corresponding to the frequencies f1 and f2 respectively from the storage circuit (17) in accordance with a decision result of the discriminating section (15)(S5). Moreover, when the received frequency f0 is not present in the range between f1 and f2, the discriminating section (15) discriminates whether the received frequency f0 is present in the range between the frequency f2 and a frequency f3 higher than the frequency f2 (S6).

When the received frequency f0 is present in the range of f2≦f0<f3, the reading section (16) reads control data Vt2 and Vt3 corresponding to the frequencies f2 and f3 respectively from the storage circuit (17) in accordance with a discrimination result of the discriminating section (15)(S7). Moreover, when the received frequency f0 is not present in the range between f2 and f3, the discriminating section (15) discriminates whether f0 is present in the range between fn-2 and fn-1 higher than fn-2 which serve as the next frequency range (S8).

When the received frequency f0 is present in the range of fn-2≦f0<fn-1, the reading section (16) reads control data Vtn-2 and Vtn-1 corresponding to frequencies fn-2 and fn-1 respectively from the storage circuit (17) in accordance with a decision result of the discriminating section (15)(S9). When the received frequency f0 is not present in the range between fn-2 and fn-1, the reading section (16) reads control data Vtn-1 and Vtn corresponding to frequencies fn-1 and fn respectively from the storage circuit (17) (S10).

Figure 5A:
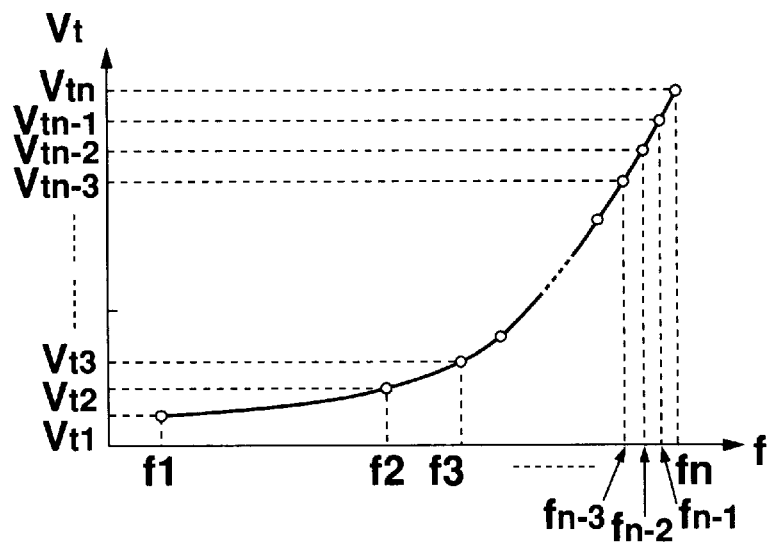
FIG. 5A is an illustration showing the relation between control data and frequency of a variable tuning element in a radio receiver of an embodiment of the present invention.

FIG. 5A shows the relation between the received frequency f0 and the control data Vt, in which the control data Vt stored in the storage circuit (17) has, for example, discontinuous interval values equal to the whole receiving band as shown by circles in FIG. 5A.

Thereafter, the arithmetic section (14) computes control signal Vx of the variable capacitance element (1a) in accordance with the channel frequency f0 shown by frequency divided data, upper and lower limit frequencies in the frequency range in which the frequency f0 is present, and control data Vt corresponding to the upper and lower limit frequencies. For example, when the received frequency f0 is present in the range of f1≦f0<f2, the arithmetic section (14) computes the control signal Vx for obtaining the tuning frequency of the received frequency f0 in accordance with the following equation (1) by using the upper and lower limit frequencies f1 and f2 in the frequency range and the control data Vt1 and Vt2 corresponding to the frequencies f1 and f2 (S11):

$$Vx = \frac{Vt2 - Vt1}{f2 - f1} \times (f0 - f1) + vt1$$

Figure 5B:
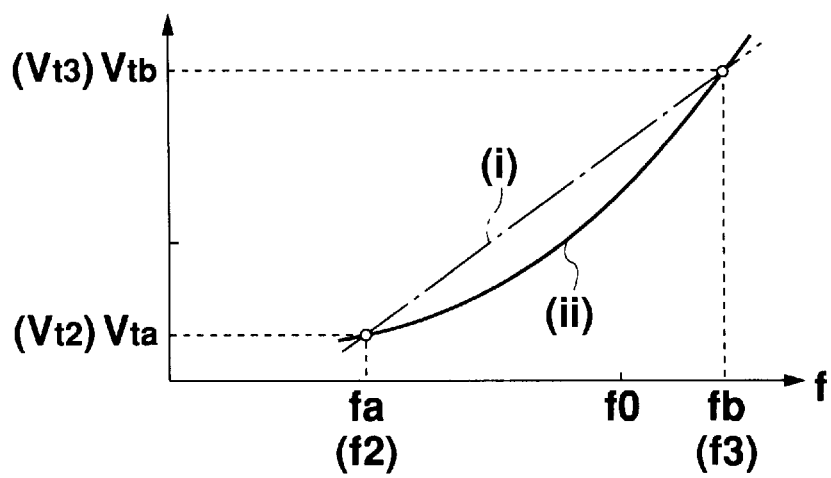
FIG. 5B is an illustration showing the relation between control data and tuning frequency when a capacitance value is controlled in accordance with the control data in a radio receiver of an embodiment of the present invention.

Thus, the control signal Vx is obtained by linear-approximating two control data values as shown in FIG. 5B in accordance with the equation (1) and located on the straight line (i) in FIG. 5B. Moreover, by considering the received frequency f0, it is possible to obtain the control signal Vx at any point on the straight line (i) in FIG. 5B. The continuous line (ii) in FIG. 5B shows a part of the curve in FIG. 5A and the control signal Vx obtained from the equation (1) shows an value obtained by approximating the measured value shown by the continuous line (ii).

The control signal Vx generated by the arithmetic section (14) is analog-converted by the D-A conversion circuit (18) and the capacitance of the variable capacitance element (1a) is changed in accordance with a control voltage generated by the D-A conversion circuit (18). Therefore, the tuning frequency of the RF tuning circuit (1) is set to a value approximately equal to the received frequency f0 (S12). Under the state in which the tuning frequency is changed, a received electric-field intensity is detected by the electric-field intensity detecting circuit (10) in accordance with an output signal of the IF amplifying circuit (5). The output signal of the electric-field intensity detecting circuit (10) is compared with a reference value by the comparison circuit (19)(S13).

As the result of the above comparison (S13), when a received electric-field intensity is smaller than a reference value (No), the frequency control circuit (12) changes frequency divided data and moreover receives the next channel (S3). However, when the received electric-field intensity is larger than the reference value (Yes), the control circuit (12) fixes the frequency divided data and a control signal and terminates the search by assuming that there is a broadcasting station (S14).

It has been described above that the discriminating section (15) discriminates whether the received frequency f0 is present in a predetermined frequency range (e.g. f1≦f0<f2) and, when the frequency f0 is present in the range, the reading section (16) reads the control data corresponding to the upper- and lower-limit frequencies from the storage circuit (17).

However, because the control data Vt and the frequency (tuning frequency) f in the variable capacitance element (1a) have a certain relation as described above (see FIG. 5A), the discrimination of whether or not the received frequency f0 is present in a predetermined frequency range and the discrimination of whether or not the data Vt0 corresponding to the frequency f0 is present in the range of two predetermined control data Vt can be regarded to be technically the same. Therefore, the function of the discriminating section (15) is not restricted to the above description. For example, it is permitted for the discriminating section (15) to directly discriminate whether the data corresponding to the given received frequency f0 (e.g. control data Vt0 corresponding to the frequency f0) is present in the range of predetermined first and second control data corresponding to the lower- and upper-limit frequencies in which the received frequency f0 is included.

Figure 5C:
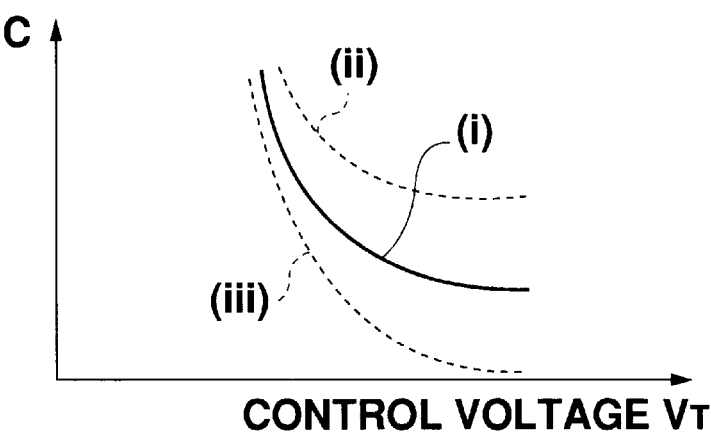
FIG. 5C is an illustration showing the relation between capacitance value and control voltage of a variable capacitance element in a radio receiver of an embodiment of the present invention.

As shown in FIG. 5A, the storage circuit (17) stores the control data Vt of the variable capacitance element (1a) corresponding to a discontinuous frequency f. In this case, the frequency f is a frequency determined in accordance with the capacitance value of a variable capacitance element of a tuning element controlled by the control data Vt, that is, a tuning frequency and its frequency intervals are unevenly set though the control data Vt has equal intervals. These frequency intervals are set wider in low frequency regions and narrower in high frequency regions. In general, a varactor diode is used as the variable capacitance element of the RF tuning circuit (1). A capacitance value C of the varactor idiode changes as shown by the continuous line (i) in FIG. 5C to a control voltage VT for controlling the capacitance value C. However, the capacitance value C to the varactor-diode control voltage VT has the dispersion shown by the dotted line (ii). Specifically, as shown in FIG. 5C, the dispersion of the frequency characteristic of a tuning element, that is, the dispersion of the capacitance value of a varactor diode decreases when the control voltage VT lowers and increases when the control voltage VT rises.

Then, the dispersion resultingly causes dispersion of the tuning frequency of the RF tuning circuit (1), and the dispersion of the tuning frequency decreases when a control voltage lowers and increases when the control voltage rises. Therefore, to obtain the frequency characteristic of the tuning element, that is, a control signal Vx0 corresponding to a proper control voltage value suitable to control the capacitance value of a varactor diode, it is necessary to decrease the interval between the frequencies made to correspond to the control signal in an area in which the capacitance value of the variable capacitance element (1a) has a large dispersion as shown in FIG. 5B. Thereby, it is possible to decrease the difference between an actual capacitance value and its approximate value. It is therefore possible to control the dispersion of the tuning frequency of the RF tuning circuit (1) due to the dispersion of the varactor diode. Therefore, in the case of this embodiment, the frequency interval is set to a large value in a low-frequency range and to a small value in a high-frequency range.

The relationship between the control signal Vt0 obtained through an operation and the tuning frequency corresponding to the capacitance of a varactor diode forms a straight line as shown by the alternate long and short dash line (i) in FIG. 5B, which is different from the actual relation by the continuous line (ii) in FIG. 5B. Therefore, a predetermined frequency is set so that the difference of the reception sensitivity of a radio receiver between the receiving state when controlling the varactor diode to an ideal capacitance by the control signal Vx0 obtained through an operation and the receiving state when an actual receiving state according to an actual capacitance of the varactor diode controlled in accordance with the control signal Vx0 comes to 3 dB or less at which deterioration of the receiving sensitivity does not deteriorate the quality of a radio receiver set.

Moreover, although the control data Vt is set at equal intervals in FIG. 5A described above, it is also possible to set this control data Vt at unequal intervals. Also in this case, it is necessary to set the control data Vt so that the difference between an ideal receiving sensitivity according to the control voltage obtained from the equation (1) and an actual receiving sensitivity according to a control voltage actually applied to a varactor diode comes to 3 dB or less.

The above-described actual relation between the above control voltage and receiving sensitivity can be obtained by actually measuring a varactor diode or from a rule of thumb. Therefore, it is possible to easily set the predetermined frequency. Thus, the number of control data values to be stored in the storage circuit (17) comes to 6 to 8. Moreover, any error does not basically occur in control signals of a variable capacitance element. However, if any error occurs in the data in the storage circuit (17) and thereby a control signal of a desired variable capacitance element cannot be obtained, it is possible to approximately equalize a tuning frequency of a RF tuning circuit with a received frequency by using a fine tuning circuit like that of the conventional example and performing fine tuning after applying the control signal.

Moreover, control data is stored in the storage circuit (17) in the adjusting step (i.e. regulating step) of the process for manufacturing a radio receiver set. When making the radio receiver set successively receive predetermined frequencies at the time of adjustment and changing control voltages of the variable capacitance element (1a), a control voltage by which the maximum electric-field intensity among the electric-field intensities detected in each channel can be obtained is stored in the storage circuit (17). Frequencies of channels to be received by a radio receiver come to discontinuous values as shown in FIG. 5A and control signals to be stored in the storage circuit (17) are also discontinuous values.

The AM radio receiver has been described above, but the art regarding the present invention can also be applied to a receiver such as an FM radio receiver in which a tracking error occurs.

As described above, Embodiment 1 makes it possible to quickly control a variable capacitance element because a control signal of a variable tuning element is computed in accordance with a received frequency from the frequency of a desired broadcasting station, the lower and upper limit values of the frequency range in which the frequency of the broadcasting station is present, and the control data of the variable capacitance element stored in a storage circuit. The time until a control signal of a variable capacitance element is obtained requires only approx. 5 msec because there are only the steps of discriminating a broadcasting station, reading control data, and computing a control signal. Therefore, it is possible to shorten the search time and quickly receive radio waves of a broadcasting station superior in electric-field intensity because a tuning frequency of a RF tuning circuit is adjusted whenever channels are changed. Moreover, because control data corresponds to each variable capacitance element and a control signal is computed by using the control data, it is unnecessary to select a variable capacitance element. Furthermore, because a tuning frequency of a RF tuning circuit is controlled within the whole receiving band by obtaining a control signal of a variable capacitance element through an operation, the sensitivity of a radio receiver is not deteriorated.

Embodiment 2

Next, Embodiment 2 of the present invention will be described below.

In Embodiment 2, an AM radio receiver equipped with a mode for receiving RF signals by an broad-band tuning in a broad band and a mode for receiving RF signals by a tuning circuit in a narrow band executes automatic broadcasting-station selection in a short period while preventing erroneous stop or erroneous passing due to intermodulation disturbance.

Therefore, in the case of Embodiment 2, search is first performed in the broad-band receiving mode and temporarily stopped in a band where a receiving intensity exceeds a reference value and reception according to the narrow-band receiving mode is performed in the band where the search is stopped during automatic broadcasting-station selection and then, the control signal Vx is computed in accordance with the received frequency f0 by the same procedure as the case of Embodiment 1, and the capacitance of a variable capacitance element is quickly controlled to adjust a tuning frequency to the received frequency f0. Under the above state, it is discriminated whether an electric field intensity exceeds a reference value. Unless the intensity exceeds the reference value, the narrow-band receiving mode is again changed to the broad-band receiving mode by assuming that there is no broadcasting station and automatic broadcasting-station selection is continued. However, when the intensity exceeds the reference value, automatic broadcasting-station selection is stopped.

Figure 6:
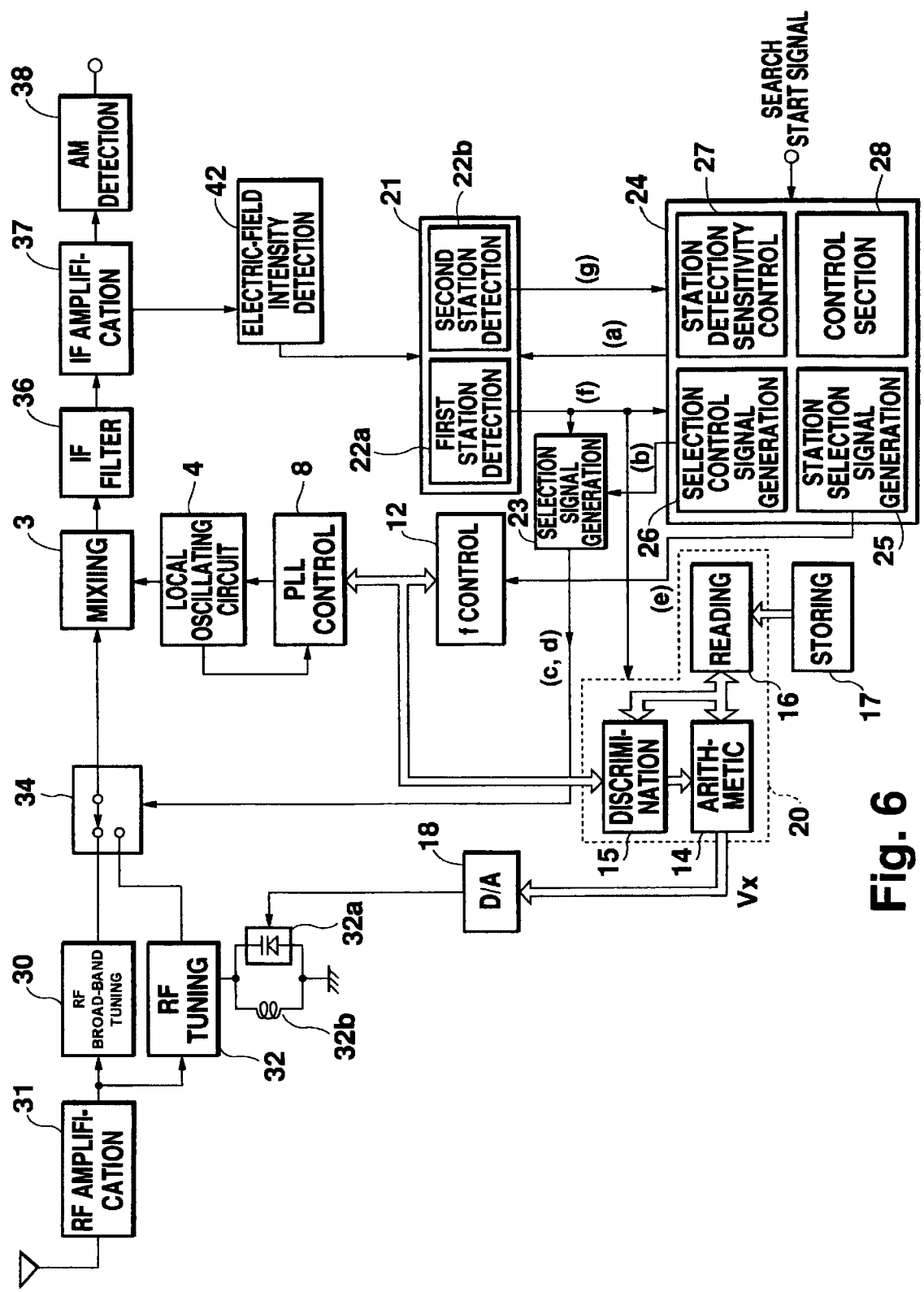
FIG. 6 is an illustration of the structure of the radio receiver of Embodiment 2 of the present invention.

FIG. 6 is an illustration showing Embodiment 2 of the present invention, in which symbol (20) denotes an arithmetic circuit which comprises an arithmetic section (14) for computing control data, a discriminating section (15) for discriminating whether the frequency divided data showing a desired broadcasting station is present in a predetermined range, and a reading section (16) for reading control data. Symbol (17) denotes a storage circuit for storing the control data at a predetermined radio frequency, (18) denotes a D-A conversion circuit for analog-converting control data and applying the converted control data to a variable capacitance element (32a) of the RF narrow-band tuning (RF tuning) circuit (32), (42) denotes an electric-field intensity detecting circuit for detecting a received electric-field intensity in accordance with an output signal of the IF amplifying circuit (37), and (21) denotes a broadcasting-station detecting circuit which comprises first and second broadcasting-station detecting circuits for generating first and second broadcasting-station detection signals (f) and (g) respectively in accordance with an output signal of the electric-field detecting circuit (42). Symbol (23) denotes a selection signal generating circuit for outputting selection signals (c) and (d) to the selection circuit (34), (24) denotes a control circuit which comprises a broadcasting-station selection signal generating circuit (25) for outputting a selection signal (e) to the frequency control circuit (13), a selection control signal generating circuit (26) for generating a selection control signal (b), a broadcasting-station detection sensitivity control circuit (27) for bringing the broadcasting-station detecting circuit (21) into operative state, and a control section (28) for controlling the broadcasting-station selection signal generating circuit (25), selection control signal generating circuit (26), and broadcasting-station detection sensitivity control circuit (27) in accordance with the first and second broadcasting-station detection signals (f) and (g) and a search start signal.

In Embodiment 2, a broadcasting-station selection control circuit comprises the frequency control circuit (12) for controlling the local oscillation frequency in accordance with received frequency and the broadcasting-station selection signal generating circuit (25) for generating the selection signal (e) to change the frequency of the local oscillation signal in accordance with search start signal.

Moreover a tuning control circuit comprises the storing circuit (17) for storing the control data in accordance with the frequency characteristic of the tuning element and the arithmetic circuit (20) for computing the control signal Vx in accordance with the control data and the data corresponding to the received frequency when the first broadcasting-station detection signal (f) is generated.

In FIG. 6, a local oscillation signal of the local oscillation circuit (4) is obtained by the fact that a PLL formed by the local oscillation circuit (4) and the PLL control circuit (8) is locked to a frequency corresponding to frequency divided data supplied from the frequency control circuit (12) and applied to the mixing circuit (3). Moreover, the capacitance value of the variable capacitance element (32a) out of the inductance element (32b) and the variable capacitance element (32a) constituting a tuning element is controlled in accordance with an output signal of the D-A conversion circuit (18) and the tuning frequency of the RF tuning circuit (32) is made almost equal to the frequency of radio waves of a desired broadcasting station. Moreover, the selection circuit (34) selects an output signal of the RF tuning circuit (32). Under this state, a received RF signal is amplified by the RF amplifying circuit (31) and thereafter, tuned and frequency-selected by the RF tuning circuit (32). An output signal of the RF tuning circuit (32) is applied to the mixing circuit (3) through the selection circuit (34), mixed with a local oscillation signal of the local oscillation circuit (4), and converted to an IF signal. Then, the IF signal is limited to a predetermined band by the IF filter (36), amplified by the IF amplifying circuit (37), and thereafter AM-detected by the AM detecting circuit (38).

Figure 7:
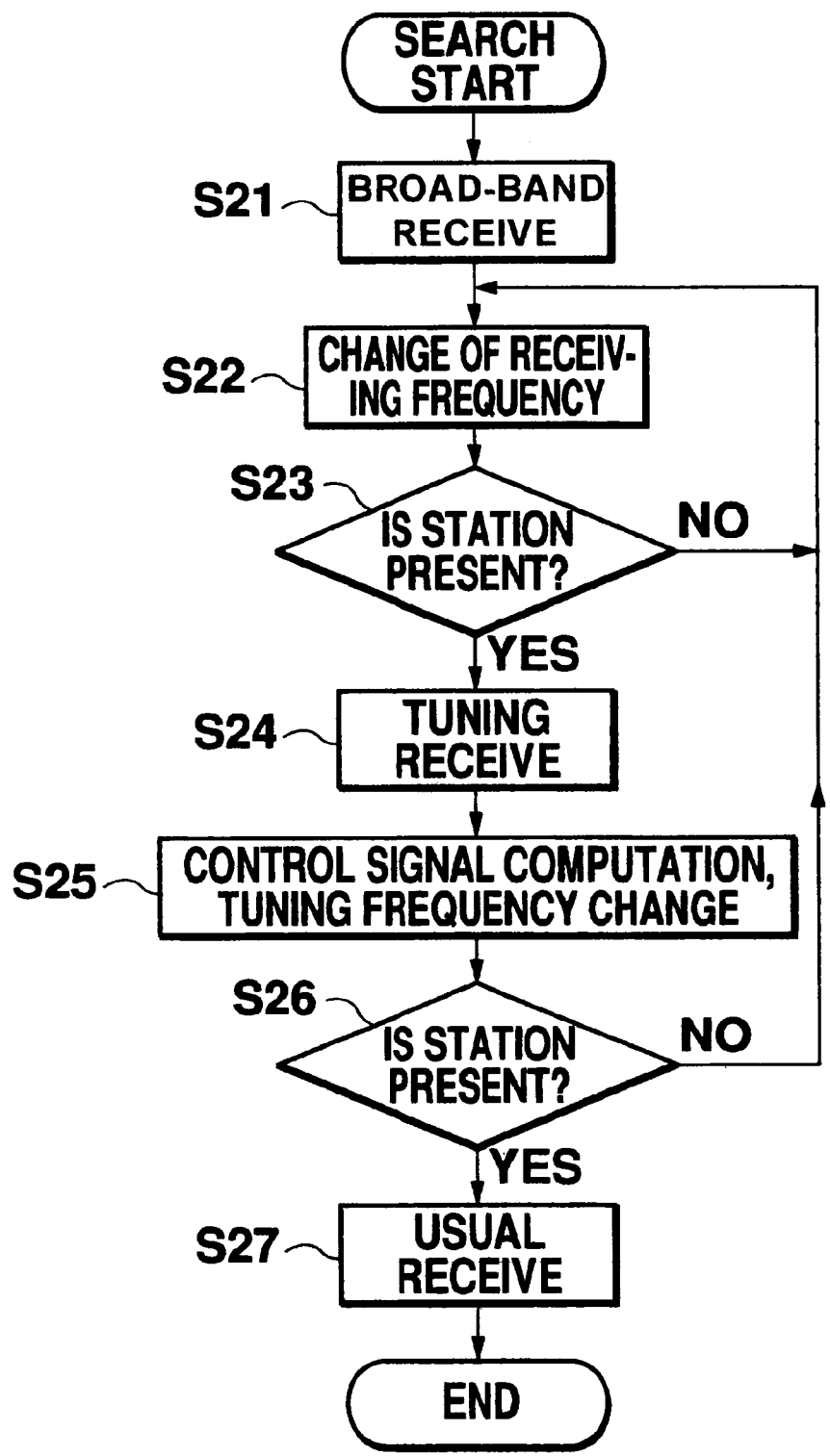
FIG. 7 is an illustration showing automatic broadcasting-station selection of the radio receiver of Embodiment 2 of the present invention.

Next, automatic broadcasting-station selection by the radio receiver in FIG. 6 will be described below, referring to the flow chart in FIG. 7. First, when a search start signal is applied to the control circuit (24), the control section (28) controls the broadcasting-station detection sensitivity control circuit (27) and the selection control signal generating circuit (26) to generate a broadcasting-station detection sensitivity control signal (a) and a selection control signal (b) respectively. The broadcasting-station detecting circuit (21) is brought under a state in which the sensitivity lowers and a state in which an output signal (f) is generated by a first broadcasting-station detecting section (22a) in accordance with the broadcasting-station detection sensitivity control signal (a), the selection signal generating circuit (23) generates a first selection signal (c) in accordance with the selection control signal (b), and the selection circuit (34) selects an output signal of the broad-band tuning circuit (30) in accordance with the first selection signal (c). Thereby, the radio receiver is set to the broad-band receiving mode, that is, the broad-band receiving mode (S21).

Then, the broadcasting-station selection signal generating circuit (25) generates a broadcasting-station selection signal (e), the frequency divided data generated by the frequency control circuit (13) becomes the next frequency divided data, that is, frequency divided data corresponding to the next channel, and local oscillation frequencies are changed. Therefore, a radio frequency to be received becomes equal to the frequency f0 of the next channel (S22). In the broad-band receiving mode, the electric-field intensity detecting circuit (42) level-detects an output signal of the IF amplifying circuit (37) and detects a received electric-field intensity.

The first broadcasting-station detecting circuit (22a) of the broadcasting-station detecting circuit (21) discriminates whether the received electric-field intensity is equal to or higher than a predetermined level (S23). When the decision result is Yes, it is assumed that a broadcasting station is present and the first broadcasting-station detection signal (f) is applied to the arithmetic circuit (20), selection signal generating circuit (22), and control circuit (24) from the first broadcasting-station detecting circuit (22a). The control section (28) controls the broadcasting-station selection signal generating circuit (25) in accordance with the first broadcasting-station detection signal (f) so that the broadcasting-station selection signal (e) is not generated. Thus, the broadcasting-station selection signal (e) is not generated and the frequency divided data of the frequency control circuit (13) is not changed. Therefore, the radio receiver holds the state of receiving the signal of the frequency f0 and search is temporarily stopped. Because the first broadcasting-station detection signal (f) is applied to the selection signal generating circuit (23) under the above state, the selection signal generating circuit (23) generates the second selection signal (d). The selection circuit (34) selects an output signal of the RF tuning circuit (32) and the radio receiver is set to the tuning receiving (narrow-band receiving) mode (S24).

However, when the decision result is No in S23, that is, when the first broadcasting-station detecting circuit (22a) detects that the received electric-field intensity is lower than the predetermined electric-field intensity in the broad-band tuning receiving mode, it is assumed that no broadcasting station is present and the first broadcasting-station detection signal (f) is not generated. Therefore, the broadcasting-station selection signal generating circuit (25) generates the broadcasting-station selection signal (e) and the frequency divided data from the frequency control circuit (12) becomes the next frequency divided data, that is, the frequency divided data corresponding to the next channel and the radio frequency is changed to the corresponding next frequency (S22).

Figure 4:
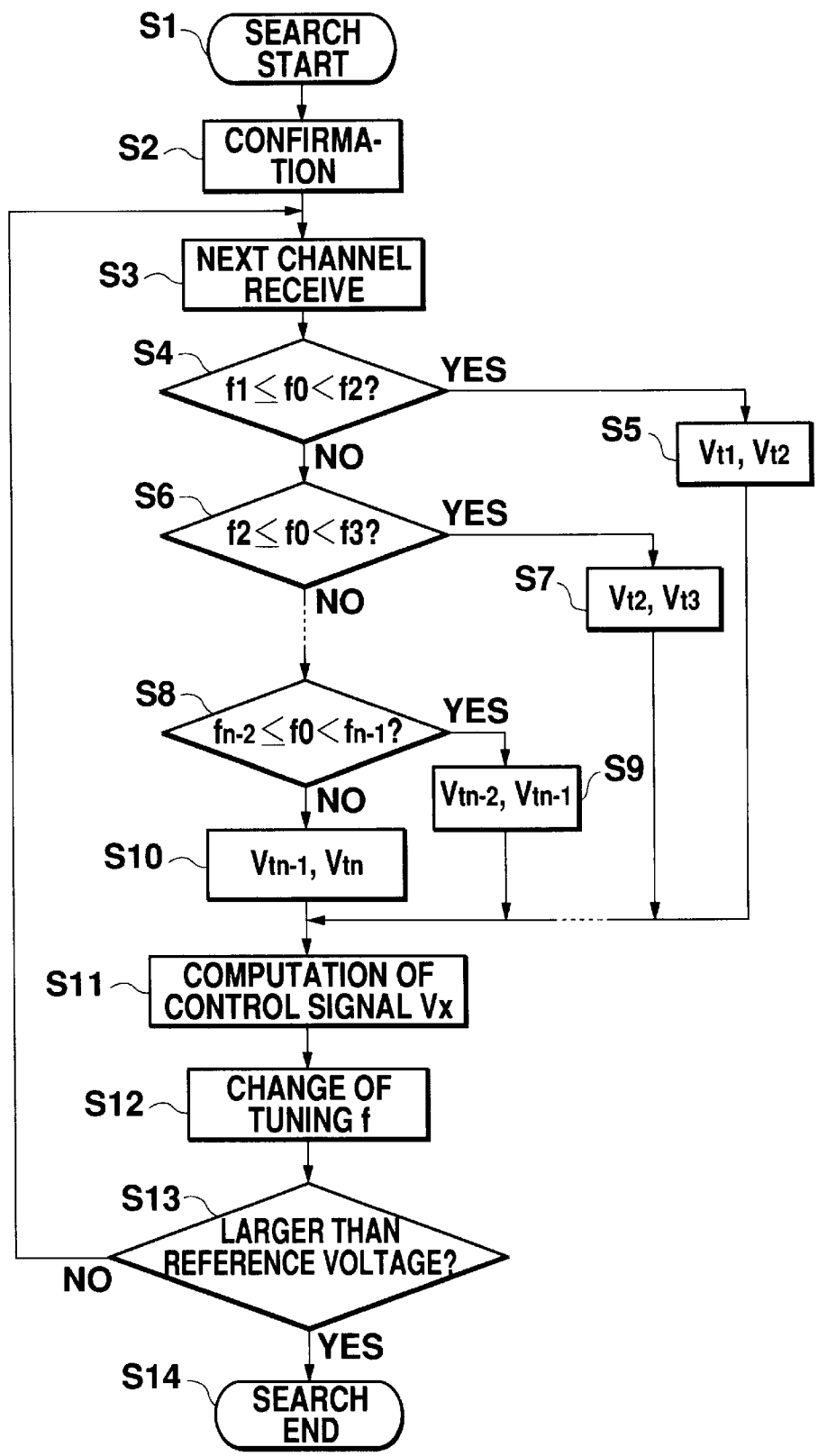
FIG. 4 is an illustration showing automatic broadcasting-station selection of the radio receiver of Embodiment 1 of the present invention.

When it is discriminated in S23 that a broadcasting station is present and a tuning receiving state is set (S24), the arithmetic circuit (20) computes the control signal Vx for controlling the capacitance value of the variable capacitance element (32a) of a tuning element in accordance with the procedures same as those in steps S2 and S4 to S11 in FIG. 4 in accordance with the first broadcasting-station detection signal (f) and tuning frequencies are changed in accordance with the computed control signal Vx (S25).

In the case of tuning reception, the selection circuit (34) supplies an output of the RF tuning circuit (32) to the mixing circuit (3). The electric-field intensity detecting circuit (42) level-detects an output signal of the IF amplifying circuit (37) and thereby detects a received electric-field intensity at the time of tuning reception.

At the time of turning reception, the sensitivity of the broadcasting-station detection signal generating circuit (21) rises in accordance with an output signal of the broadcasting-station detection sensitivity control circuit (27) and a state is set in which an output signal is generated by the second broadcasting-station detecting circuit (22b). Therefore, the second broadcasting-station detecting section (22b) detects whether the output signal level of the IF amplifying circuit (37) is equal to or higher than a predetermined value (S26).

When the received electric-field intensity is equal to or larger than the predetermined value (Yes), the second detecting circuit (22b) detects that a broadcasting station is present and generates the second broadcasting-station detection signal (g) in accordance with an output signal of the electric-field intensity detecting circuit (42). In accordance with the second broadcasting-station detection signal (g), the broadcasting-station selection signal generating circuit (25), selection control signal generating circuit (26), and broadcasting-station detection sensitivity control circuit (27) are brought into the state of generating no output signal. Therefore, the frequency divided data of the frequency control circuit (12) is held and sear of the radio receiver is completely stopped. Moreover, the second selection signal (d) is continuously generated by the selection signal generating circuit (23) and the tuning receiving state is continued. Moreover, the broadcasting-station detection signal generating circuit (21) stops operation. Therefore, the radio receiver receives radio waves of a broadcasting station detected through search and is brought under the normal receiving state (S27). Furthermore, when the decision result in S26 is No and the second broadcasting-station detection signal (g) is not detected, it is decided that no broadcasting station is present. Therefore, the radio receiver is brought under the broad-band receiving state and moreover, the frequency is changed to the next radio frequency and search is restarted (S23).

Thus, because a control signal of the variable capacitance element (32a) is obtained through operations, it is possible to quickly control the variable capacitance element (32a) and shorten the search time. Moreover, because a control signal of the tuning element (32) is obtained through linear approximation in accordance with the control data of the storage circuit (17), tracking errors occur in no small numbers. However, because the control data of the storage circuit (17) is set so that the reduction of radio frequencies due to tracking errors comes to 3 dB or less, there are not many bad influences due to tracking errors for the reduction of 3 dB or less. Moreover, by changing broadcasting-station detection sensitivities in accordance with the tuning receiving mode and broad-band receiving mode, it is possible to prevent broadcasting-station detection levels from changing due to a tracking error and secure the minimum broadcasting-station detection level.

What is claimed is:

1. A radio receiver comprising:
    a radio frequency tuning circuit including a tuning element having a variable frequency characteristic for receiving radio frequency broadcasting signals;
    a mixing circuit for converting a signal output from the radio frequency tuning circuit to an intermediate-frequency signal using a local oscillation signal;
    a local oscillation circuit for generating the local oscillation signal;
    a frequency control circuit coupled to an automatic broadcasting-station selection start signal for changing the frequency of the local oscillation signal;
    a storing circuit for storing control data corresponding to the frequency characteristic of the tuning element; and
    an arithmetic circuit coupled to the frequency control circuit for generating, in response to the frequency control circuit changing the frequency of the local oscillation signal, a tuning control signal based on the control data and data corresponding to a received frequency and the changed local oscillation frequency to control the frequency characteristic of the tuning element; and
    a broadcasting-station detecting circuit coupled to the mixing circuit for detecting the presence of a broadcasting station in the received RF signal;
    wherein the frequency control circuit stops changing the frequency of the local oscillation signal in response to the broadcasting-station detecting circuit detecting the presence of a broadcasting-station, and
    wherein the interval between the control data values is narrowly set in an area in which the frequency characteristic of the tuning element has a large dispersion and widely set in an area in which the frequency characteristic of it has a small dispersion.

2. The radio receiver according to claim 1, wherein the arithmetic circuit comprises
    a discriminating section for discriminating whether the data corresponding to the received frequency is present between first control data stored in the storage circuit and second control data larger than the first control data and stored in the storage circuit, and
    an arithmetic section for generating the control signal by computation in accordance with the first and second control data and the data corresponding to the received frequency when the data corresponding to the received frequency has been decided between the first control data and the second control data.

3. The radio receiver according to claim 2, wherein the arithmetic section computes a control signal Vx by using the received frequency f0, a frequency f1 lower than the received frequency f0 and a frequency f2 higher than the frequency f0, and the first control data Vt1 and second control data Vt2 corresponding to the frequencies f1 and f2 respectively and thereby computing the following equation:

$$Vx = \frac{Vt2 - Vt1}{f2 - f1} \times (f0 - f1) + vt1.$$

4. The radio receiver according to claim 1, wherein the control data stored in the storage circuit serves, at the time of regulating for the radio receiver, as the data for supplying a signal with a predetermined frequency to the radio receiver, detecting received electric-field intensities in the radio receiver corresponding to each control data while fine-adjusting the control data, selecting control data for obtaining the maximum received electric-field intensity out of the received electric-field intensities, and being stored in the storage circuit.

5. The radio receiver according to claim 1, wherein the interval between the frequencies made to correspond to the control data is narrowly set in a frequency range in which the frequency characteristic of the tuning element has a large dispersion and widely set in a frequency range in which the frequency characteristic of it has a small dispersion.

6. The radio receiver according to claim 1, wherein the tuning element is constituted with an inductance element and a variable capacitance element, and the capacitance value of the tuning element is controlled in accordance with the control signal supplied from the arithmetic circuit and the tuning element tunes in a received frequency.

7. A radio receiver comprising:
a radio frequency narrow-band tuning circuit including a tuning element and having a first frequency selection characteristic;
a radio frequency broad-band tuning circuit having a second frequency selection characteristic wider than the first frequency selection characteristic;
a selection circuit for selecting either output signals from the radio frequency broad-band tuning circuit or output signals from the radio frequency narrow-band tuning circuit;
a mixing circuit for converting an output signal supplied from the selection circuit to an intermediate-frequency signal using a local oscillation signal;
a local oscillation circuit for generating the local oscillation signal;
a first broadcasting-station detecting circuit coupled to the mixing circuit for detecting the presence of a broadcasting station when the radio frequency broad-band tuning circuit is selected;
a second broadcasting-station detecting circuit coupled to the mixing circuit for detecting the presence of a broadcasting-station when the radio frequency narrow-band tuning circuit is selected;
a storing circuit for storing control data corresponding to the frequency characteristic of the tuning element;
an arithmetic circuit for generating a tuning control signal based on the control data and data corresponding to a received frequency to control the frequency characteristic of the tuning element; and
a control circuit coupled to an automatic broadcasting-station selection start signal and the first and second broadcasting-station detection circuits for controlling the local oscillation circuit, the arithmetic circuit and the selection circuit;

wherein the control circuit changes the frequency of the local oscillation signal in response to an automatic broadcasting-station selection start signal, controls the selection circuit to select the radio frequency broad-band tuning circuit at each local oscillation frequency, controls the selection circuit to select the radio frequency narrow-band tuning circuit in response to the first broadcasting-station detecting circuit detecting the presence of a broadcasting station, controls the arithmetic circuit to generate the tuning control signal to control the tuning element when the radio frequency narrow-band tuning circuit is selected, and stops the changing of the frequency of the local oscillation signal in response to the second broadcasting-station detection detecting the presence of a broadcasting station when the radio frequency narrow-band tuning circuit is selected.

8. The radio receiver according to claim 7, wherein the control circuit comprises
a frequency control circuit for controlling the frequency of the local oscillation signal in accordance with a received frequency, and
a broadcasting-station selection signal generating section for generating a broadcasting-station selection signal for changing the frequencies of the local oscillation signal in accordance with an automatic broadcasting-station selection start signal.

9. The radio receiver according to claim 7, wherein the arithmetic circuit comprises
a discriminating section for discriminating whether the data corresponding to the received frequency is present between the first control data stored in the storage circuit and second control data larger than the first control data and stored in the storage circuit, and
an arithmetic section for computing a control signal in accordance with the first and second control data and the data corresponding to the received frequency when the data corresponding to the received frequency is present between the first control data and the second control data.

10. The radio receiver according to claim 9, wherein the arithmetic section computes a control signal Vx by using the received frequency f0, a frequency f1 lower than the received frequency f0 and a frequency f2 higher than the received frequency f0, and the first control data Vt1 and the second control data Vt2 corresponding to the frequencies f1 and f2 respectively and thereby computing the following equation:

$$Vx = \frac{Vt2 - Vt1}{f2 - f1} \times (f0 - f1) + vt1.$$

11. The radio receiver according to claim 7, wherein the broadcasting-station detection sensitivity of the second broadcasting-station detecting circuit is set to a value larger than the broadcasting-station detecting sensitivity of the first broadcasting-station detecting circuit.

12. The radio receiver according to claim 7, wherein the control data stored in the storage circuit serves, at the time of regulating for the radio receiver, as the data for supplying a signal with a predetermined frequency to the radio receiver, detecting received electric-field intensities in the radio receiver corresponding to each control data while fine-adjusting the control data, selecting control data for obtaining the maximum received electric-field intensity out of the received electric-field intensities, and being stored in the storage circuit.

13. The radio receiver according to claim 7, wherein the interval between the control data values is narrowly set in an area in which the frequency characteristic of the tuning element has a large dispersion and widely set in an area in which the frequency characteristic of it has a small dispersion.

14. The radio receiver according to claim 7, wherein the interval between the frequencies made to correspond to the control data is narrowly set in a frequency range in which the frequency characteristic of the tuning element has a large dispersion and widely set in a frequency range in which the frequency characteristic of it has a small dispersion.

15. The radio receiver according to claim 7, wherein the tuning element is constituted with an inductance element and a variable capacitance element, and the capacitance value of the tuning element is controlled in accordance with the control signal supplied from the arithmetic circuit and the tuning element tunes in a received frequency.

16. A method for tuning a radio receiver having a radio frequency tuning circuit including a tuning element and having an automatic broadcasting-station selecting function, the method comprising:

(a) changing a local oscillation frequency;

(b) generating a tuning control signal by an arithmetic circuit based on data corresponding to a received frequency and the changed local oscillation frequency and control data stored in a storage section, the control data corresponding to the frequency characteristic of the tuning element;

(c) adjusting the tuning frequency of the radio frequency tuning circuit by controlling a frequency characteristic of the tuning element using the tuning control signal;

(d) detecting the presence of a broadcasting station after the tuning frequency is adjusted;

(e) repeating steps (a)–(d) if the presence of a broadcasting station is not detected; and (f) stopping the changing of the local oscillation frequency if the presence of a broadcasting station is detected, wherein the frequency characteristics of the tuning element has a non-uniform variation within a frequency range, wherein the control data comprise a sequence of discrete frequency data items and corresponding voltage data items, and wherein the frequency difference between adjacent frequency data items and/or the voltage difference between adjacent voltage data items is smaller where the variation in the frequency characteristics of the tuning element is larger.

17. The method of claim 16 wherein the step of generating a tuning control signal comprises:

judging whether the data corresponding to the received frequency is between a first control data point and a second control data point; and computing the tuning control signal by linearly interpolating the data corresponding to the received frequency between the first and the second control data points when it is judged that the data corresponding to the received frequency is between the first and the second control data points.

18. A method for tuning a radio receiver having a radio frequency broad-band tuning circuit and a radio frequency narrow-band tuning circuit including a tuning element and having an automatic broadcasting-station selecting function, the method comprising:

(a) changing a local oscillation frequency;

(b) selecting the output signal from the radio frequency broad-band tuning circuit;

(c) detecting the presence of a broadcasting station when the radio frequency broad-band tuning circuit is selected;

(d) selecting the output signal from the radio frequency narrow-band tuning circuit if a broadcasting station is detected in step (c);

(e) repeating steps (a)–(d) if a broadcasting station is not detected in step (c);

(f) generating, when the output signal from the radio frequency narrow-band tuning circuit is selected, a tuning control signal by an arithmetic circuit based on data corresponding to a received frequency and the changed local oscillation frequency and control data stored in a storage section, the control data corresponding to the frequency characteristic of the tuning element;

(g) adjusting the tuning frequency of the radio frequency narrow-band tuning circuit by controlling a frequency characteristic of the tuning element using the tuning control signal;

(h) detecting the presence of a broadcasting station after the tuning frequency of the radio frequency narrow-band tuning circuit is adjusted;

(i) repeating steps (a)–(h) if the presence of a broadcasting station is not detected in step (h); and (j) stopping the changing of the local oscillation frequency if the presence of a broadcasting station is detected in step (h).

19. The method of claim 18, wherein the frequency characteristics of the tuning element has a non-uniform variation within a frequency range, wherein the control data comprise a sequence of discrete frequency data items and corresponding voltage data items, and wherein the frequency difference between adjacent frequency data items and/or the voltage difference between adjacent voltage data items is smaller where the variation in the frequency characteristics of the tuning element is larger.

20. The method of claim 18 wherein the step of generating a tuning control signal comprises:

judging whether the data corresponding to the received frequency is between a first control data point and a second control data point; and computing the tuning control signal by linearly interpolating the data corresponding to the received frequency between the first and the second control data points when it is judged that the data corresponding to the received frequency is between the first and the second control data points.

21. A radio receiver comprising:

a radio frequency tuning circuit including a tuning element having a variable frequency characteristic for receiving radio frequency broadcasting signals;

a mixing circuit for converting a signal output from the radio frequency tuning circuit to an intermediate-frequency signal using a local oscillation signal;

a local oscillation circuit for generating the local oscillation signal;

a frequency control circuit coupled to an automatic broadcasting-station selection start signal for changing the frequency of the local oscillation signal;

a storing circuit for storing control data corresponding to the frequency characteristic of the tuning element; and an arithmetic circuit coupled to the frequency control circuit for generating, in response to the frequency control circuit changing the frequency of the local oscillation signal, a tuning control signal based on the control data and data corresponding to a received frequency and the changed local oscillation frequency to control the frequency characteristic of the tuning element; and a broadcasting-station detecting circuit coupled to the mixing circuit for detecting the presence of a broadcasting station in the received RF signal;

wherein the frequency control circuit stops changing the frequency of the local oscillation signal in response to the broadcasting-station detecting circuit detecting the presence of a broadcasting-station, and wherein the interval between the frequencies made to correspond to the control data is narrowly set in a frequency range in which the frequency characteristic of the tuning element has a large dispersion and widely set in a frequency range in which the frequency characteristic of it has a small dispersion.

22. The radio receiver according to claim 21, wherein the arithmetic circuit comprises a discriminating section for discriminating whether the data corresponding to the received frequency is present between the first control data stored in the storage circuit and second control data larger than the first control data and stored in the storage circuit; and an arithmetic section for generating the control signal by computation in accordance with the first and second control data and the data corresponding to the received frequency when the data corresponding to the received frequency has been decided between the first control data and the second control data.

23. The radio receiver according to claim 22, wherein the arithmetic section computes a control signal Vx by using the received frequency f0, a frequency f1 lower than the received frequency f0 and a frequency f2 higher than the frequency f0, and the first control data Vt1 and second control data Vt2 corresponding to the frequencies f1 and f2 respectively and thereby computing the following equation:

$$Vx = \frac{Vt2 - Vt1}{f2 - f1} \times (f0 - f1) + vt1.$$

24. The radio receiver according to claim 21, wherein the control data stored in the storage circuit serves, at the time of regulating for the radio receiver, as the data for supplying a signal with a predetermined frequency to the radio receiver, detecting received electric-field intensities in the radio receiver corresponding to each control data while fine-adjusting the control data, selecting control data for obtaining the maximum received electric-field intensity out of the received electric-field intensities, and being stored in the storage circuit.

25. The radio receiver according to claim 21, wherein the tuning element is constituted with an inductance element and a variable capacitance element, and the capacitance value of the tuning element is controlled in accordance with the control signal supplied from the arithmetic circuit and the tuning element tunes in a received frequency.

26. A radio receiver comprising:

a radio frequency tuning circuit including a tuning element having a variable frequency characteristic for receiving radio frequency broadcasting signals;

a mixing circuit for converting a signal output from the radio frequency tuning circuit to an intermediate-frequency signal using a local oscillation signal;

a local oscillation circuit for generating the local oscillation signal;

a frequency control circuit coupled to an automatic broadcasting-station selection start signal for changing the frequency of the local oscillation signal;

a storing circuit for storing control data corresponding to the frequency characteristic of the tuning element; and an arithmetic circuit coupled to the frequency control circuit for generating, in response to the frequency control circuit changing the frequency of the local oscillation signal, a tuning control signal based on the control data and data corresponding to a received frequency and the changed local oscillation frequency to control the frequency characteristic of the tuning element; and a broadcasting-station detecting circuit coupled to the mixing circuit for detecting the presence of a broadcasting station in the received RF signal;

wherein the frequency control circuit stops changing the frequency of the local oscillation signal in response to the broadcasting-station detecting circuit detecting the presence of a broadcasting-station, wherein the interval between the control data values is narrowly set in an area in which the frequency characteristic of the tuning element has a large dispersion and widely set in an area in which the frequency characteristic of it has a small dispersion, and wherein the interval between the frequencies made to correspond to the control data is narrowly set in a frequency range in which the frequency characteristic of the tuning element has a large dispersion and widely set in a frequency range in which the frequency characteristic of it has a small dispersion.

27. The radio receiver according to claim 26, wherein the arithmetic circuit comprises a discriminating section for discriminating whether the data corresponding to the received frequency is present between the first control data stored in the storage circuit and second control data larger than the first control data and stored in the storage circuit; and an arithmetic section for generating the control signal by computation in accordance with the first and second control data and the data corresponding to the received frequency when the data corresponding to the received frequency has been decided between the first control data and the second control data.

28. The radio receiver according to claim 27, wherein the arithmetic section computes a control signal Vx by using the received frequency f0, a frequency f1 lower than the received frequency f0 and a frequency f2 higher than the frequency f0, and the first control data Vt1 and second control data Vt2 corresponding to the frequencies f1 and f2 respectively and thereby computing the following equation:

$$Vx = \frac{Vt2 - Vt1}{f2 - f1} \times (f0 - f1) + vt1.$$

29. The radio receiver according to claim 26, wherein the control data stored in the storage circuit serves, at the time of regulating for the radio receiver, as the data for supplying a signal with a predetermined frequency to the radio receiver, detecting received electric-field intensities in the radio receiver corresponding to each control data while fine-adjusting the control data, selecting control data for obtaining the maximum received electric-field intensity out of the received electric-field intensities, and being stored in the storage circuit.

30. The radio receiver according to claim 26, wherein the tuning element is constituted with an inductance element and a variable capacitance element, and the capacitance value of the tuning element is controlled in accordance with the control signal supplied from the arithmetic circuit and the tuning element tunes in a received frequency.

31. A radio receiver comprising:

a radio frequency narrow-band tuning circuit including a tuning element and having a first frequency selection characteristic;

a radio frequency broad-band tuning circuit having a second frequency selection characteristic wider than the first frequency selection characteristic;

a selection circuit for selecting either output signals from the radio frequency broad-band tuning circuit or output signals from the radio frequency narrow-band tuning circuit;

a mixing circuit for converting an output signal supplied from the selection circuit to an intermediate-frequency signal using a local oscillation signal;

a local oscillation circuit for generating the local oscillation signal;

a first broadcasting-station detecting circuit coupled to the mixing circuit for detecting the presence of a broadcasting station when the radio frequency broad-band tuning circuit is selected;

a second broadcasting-station detecting circuit coupled to the mixing circuit for detecting the presence of a broadcasting-station when the radio frequency narrow-band tuning circuit is selected;

a storing circuit for storing control data corresponding to the frequency characteristic of the tuning element;

an arithmetic circuit for generating a tuning control signal based on the control data and data corresponding to a received frequency to control the frequency characteristic of the tuning element; and a control circuit coupled to an automatic broadcasting-station selection start signal and the first and second broadcasting-station detection circuits for controlling the local oscillation circuit, the arithmetic circuit and the selection circuit;

wherein the control circuit changes the frequency of the local oscillation signal in response to an automatic broadcasting-station selection start signal, controls the selection circuit to select the radio frequency broad-band tuning circuit at each local oscillation frequency, controls the selection circuit to select the radio frequency narrow-band tuning circuit in response to the first broadcasting-station detection circuit detecting the presence of a broadcasting station, controls the arithmetic circuit to generate the tuning control signal to control the tuning element when the radio frequency narrow-band tuning circuit is selected, and stops the changing of the frequency of the local oscillation signal in response to the second broadcasting-station detection detecting the presence of a broadcasting station when the radio frequency narrow-band tuning circuit is selected, and wherein the interval between the control data values is narrowly set in an area in which the frequency characteristic of the tuning element has a large dispersion and widely set in an area in which the frequency characteristic of it has a small dispersion.

32. The radio receiver according to claim 31, wherein the broadcasting-station selection control circuit comprises a frequency control circuit for controlling the frequency of the local oscillation signal in accordance with a received frequency, and a broadcasting-station selection signal generating section for generating a broadcasting-station selection signal for changing the frequencies of the local oscillation signal in accordance with an automatic broadcasting station-selection start signal.

33. The radio receiver according to claim 31, wherein the arithmetic circuit comprises a discriminating section for discriminating whether the data corresponding to the received frequency is present between the first control data stored in the storage circuit and second control data larger than the first control data and stored in the storage circuit, and an arithmetic section for computing a control signal in accordance with the first and second control data and the data corresponding to the received frequency when the data corresponding to the received frequency is present between the first control data and the second control data.

34. The radio receiver according to claim 33, wherein the arithmetic section computes a control signal Vx by using the received frequency f0, a frequency f1 lower than the received frequency f0 and a frequency f2 higher than the received frequency f0, and the first control data Vt1 and the second control data Vt2 corresponding to the frequencies f1 and f2 respectively and thereby computing the following equation:

$$Vx = \frac{Vt2 - Vt1}{f2 - f1} \times (f0 - f1) + vt1.$$

35. The radio receiver according to claim 31, wherein the broadcasting-station detection sensitivity of the second broadcasting-station detecting circuit is set to a value larger than the broadcasting-station detecting sensitivity of the first broadcasting-station detecting circuit.

36. The radio receiver according to claim 31, wherein the control data stored in the storage circuit serves, at the time of regulating for the radio receiver, as the data for supplying a signal with a predetermined frequency to the radio receiver, detecting received electric-field intensities in the radio receiver corresponding to each control data while fine-adjusting the control data, selecting control data for obtaining the maximum received electric-field intensity out of the received electric-field intensities, and being stored in the storage circuit.

37. The radio receiver according to claim 31, wherein the interval between the frequencies made to correspond to the control data is narrowly set in a frequency range in which the frequency characteristic of the tuning element has a large dispersion and widely set in a frequency range in which the frequency characteristic of it has a small dispersion.

38. The radio receiver according to claim 31 wherein the tuning element is constituted with an inductance element and a variable capacitance element, and the capacitance value of the tuning element is controlled in accordance with the control signal supplied from the arithmetic circuit and the tuning element tunes in a received frequency.

39. A radio receiver comprising:
a radio frequency narrow-band tuning circuit including a tuning element and having a first frequency selection characteristic;
a radio frequency broad-band tuning circuit having a second frequency selection characteristic wider than the first frequency selection characteristic;
a selection circuit for selecting either output signals from the radio frequency broad-band tuning circuit or output signals from the radio frequency narrow-band tuning circuit;
a mixing circuit for converting an output signal supplied from the selection circuit to an intermediate-frequency signal using a local oscillation signal;
a local oscillation circuit for generating the local oscillation signal;
a first broadcasting-station detecting circuit coupled to the mixing circuit for detecting the presence of a broadcasting station when the radio frequency broad-band tuning circuit is selected;
a second broadcasting-station detecting circuit coupled to the mixing circuit for detecting the presence of a broadcasting-station when the radio frequency narrow-band tuning circuit is selected;
a storing circuit for storing control data corresponding to the frequency characteristic of the tuning element;
an arithmetic circuit for generating a tuning control signal based on the control data and data corresponding to a received frequency to control the frequency characteristic of the tuning element; and
a control circuit coupled to an automatic broadcasting-station selection start signal and the first and second broadcasting-station detection circuits for controlling the local oscillation circuit, the arithmetic circuit and the selection circuit;
wherein the control circuit changes the frequency of the local oscillation signal in response to an automatic broadcasting-station selection start signal, controls the selection circuit to select the radio frequency broad-band tuning circuit at each local oscillation frequency, controls the selection circuit to select the radio frequency narrow-band tuning circuit in response to the first broadcasting-station detection circuit detecting the presence of a broadcasting station, controls the arithmetic circuit to generate the tuning control signal to control the tuning element when the radio frequency narrow-band tuning circuit is selected, and stops the changing of the frequency of the local oscillation signal in response to the second broadcasting-station detection detecting the presence of a broadcasting station when the radio frequency narrow-band tuning circuit is selected, and wherein the interval between the frequencies made to correspond to the control data is narrowly set in a frequency range in which the frequency characteristic of the tuning element has a large dispersion and widely set in a frequency range in which the frequency characteristic of it has a small dispersion.

40. The radio receiver according to claim 39, wherein the broadcasting-station selection control circuit comprises
a frequency control circuit for controlling the frequency of the local oscillation signal in accordance with a received frequency, and
a broadcasting-station selection signal generating section for generating a broadcasting-station selection signal for changing the frequencies of the local oscillation signal in accordance with an automatic broadcasting station-selection start signal.

41. The radio receiver according to claim 39, wherein the arithmetic circuit comprises
a discriminating section for discriminating whether the data corresponding to the received frequency is present between the first control data stored in the storage circuit and second control data larger than the first control data and stored in the storage circuit, and
an arithmetic section for computing a control signal in accordance with the first and second control data and the data corresponding to the received frequency when the data corresponding to the received frequency is present between the first control data and the second control data.

42. The radio receiver according to claim 41, wherein the arithmetic section computes a control signal Vx by using the received frequency f0, a frequency f1 lower than the received frequency f0 and a frequency f2 higher than the received frequency f0, and the first control data Vt1 and the second control data Vt2 corresponding to the frequencies f1 and f2 respectively and thereby computing the following equation:

$$Vx = \frac{Vt2 - Vt1}{f2 - f1} \times (f0 - f1) + vt1.$$

43. The radio receiver according to claim 39, wherein the broadcasting-station detection sensitivity of the second broadcasting-station detecting circuit is set to a value larger than the broadcasting-station detecting sensitivity of the first broadcasting-station detecting circuit.

44. The radio receiver according to claim 39, wherein the control data stored in the storage circuit serves, at the time of regulating for the radio receiver, as the data for supplying a signal with a predetermined frequency to the radio receiver, detecting received electric-field intensities in the radio receiver corresponding to each control data while fine-adjusting the control data, selecting control data for obtaining the maximum received electric-field intensity out of the received electric-field intensities, and being stored in the storage circuit.

45. The radio receiver according to claim 39 wherein the tuning element is constituted with an inductance element and a variable capacitance element, and the capacitance value of the tuning element is controlled in accordance with the control signal supplied from the arithmetic circuit and the tuning element tunes in a received frequency.

46. A method for tuning a radio receiver having a radio frequency broad-band tuning circuit and a radio frequency narrow-band tuning circuit including a tuning element and having an automatic broadcasting-station selecting function, the method comprising:

(a) changing a local oscillation frequency;

(b) selecting the output signal from the radio frequency broad-band tuning circuit;

(c) detecting the presence of a broadcasting station when the radio frequency broad-band tuning circuit is selected;

(d) selecting the output signal from the radio frequency narrow-band tuning circuit if a broadcasting station is detected in step (c);

(e) repeating steps (a)–(d) if a broadcasting station is not detected in step (c);

(f) generating, when the output signal from the radio frequency narrow-band tuning circuit is selected, a tuning control signal by an arithmetic circuit based on data corresponding to a received frequency and the changed local oscillation frequency and control data stored in a storage section, the control data corresponding to the frequency characteristic of the tuning element;

(g) adjusting the tuning frequency of the radio frequency narrow-band tuning circuit by controlling a frequency characteristic of the tuning element using the tuning control signal;

(h) detecting the presence of a broadcasting station after the tuning frequency of the radio frequency narrow-band tuning circuit is adjusted;

(i) repeating steps (a)–(h) if the presence of a broadcasting station is not detected in step (h); and (j) stopping the changing of the local oscillation frequency if the presence of a broadcasting station is detected in step (h), wherein the frequency characteristics of the tuning element has a non-uniform variation within a frequency range, wherein the control data comprise a sequence of discrete frequency data items and corresponding voltage data items, and wherein the frequency difference between adjacent frequency data items and/or the voltage difference between adjacent voltage data items is smaller where the variation in the frequency characteristics of the tuning element is larger.

* * * * *